United States Patent
Choi et al.

(10) Patent No.: US 6,381,188 B1
(45) Date of Patent: *Apr. 30, 2002

(54) DRAM CAPABLE OF SELECTIVELY PERFORMING SELF-REFRESH OPERATION FOR MEMORY BANK

(75) Inventors: Jong-hyun Choi, Suwon; Dong-il Seo; Jong-sik Na, both of Yongin, all of (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/481,251

(22) Filed: Jan. 11, 2000

(30) Foreign Application Priority Data

Jan. 12, 1999 (KR) ................................. 99-541
Dec. 16, 1999 (KR) ............................. 99-58273

(51) Int. Cl.$^7$ ................................................ G11C 7/00
(52) U.S. Cl. ...................... 365/222; 365/227; 365/225.7
(58) Field of Search ................................. 365/222, 227, 365/225.7

(56) References Cited

U.S. PATENT DOCUMENTS

| | | | |
|---|---|---|---|
| 4,758,993 A | | 7/1988 | Takemae ..................... 365/222 |
| 4,943,960 A | * | 7/1990 | Komatsu et al. ............. 365/222 |
| 4,961,167 A | * | 10/1990 | Kymanoya et al. .... 365/189.09 |
| 5,404,543 A | | 4/1995 | Faucher et al. .............. 395/750 |
| 5,594,699 A | * | 1/1997 | Nomura et al. .............. 365/226 |
| 5,798,976 A | | 8/1998 | Arimoto ...................... 365/222 |
| 5,995,434 A | * | 11/1999 | Ryu ............................. 365/222 |
| 6,137,743 A | * | 10/2000 | Kim ............................. 365/222 |

FOREIGN PATENT DOCUMENTS

EP          0820065          1/1998

* cited by examiner

Primary Examiner—Richard Elms
Assistant Examiner—Tuan T. Nguyen
(74) Attorney, Agent, or Firm—Mills & Onello LLP

(57) ABSTRACT

A dynamic random access memory (DRAM) including a plurality of memory banks is capable of selectively performing a self-refresh operation with respect to only a subset of the banks. The DRAM includes a plurality of row decoders for selecting word lines of the memory cells of the memory banks, an address generator for generating internal addresses which sequentially vary during a self-refresh mode, a refresh bank designating circuit for generating refresh bank designating signals for designating a memory bank to be refreshed, and a bank selection decoder for designating one or more memory banks to be refreshed by the refresh bank designating signals and supplying refresh addresses to the row decoders corresponding to the designated memory banks according to the information of the internal addresses. The self-refresh operation is performed for only selected memory banks, or alternatively, only in those memory banks in which data is stored, thereby minimizing power consumption.

14 Claims, 11 Drawing Sheets

DRAM CAPABLE OF SELECTIVELY PERFORMING SELF-REFRESH OPERATION FOR MEMORY BANK

BACKGROUND OF THE INVENTION

1. Field of the Invention

The present invention relates to a semiconductor memory device, and more particularly, to a dynamic random access memory for performing a refresh operation for recharging stored data.

2. Description of the Related Art

Semiconductor memory devices are largely classified as dynamic random access memories (DRAM) and static random access memories (SRAM). In an SRAM, a unit cell is implemented by four transistors constituting a latching mechanism. Unless the power is interrupted, the stored data is not volatile. Thus, a refresh operation is not necessary. However, in a DRAM, a unit cell is implemented by one transistor and one capacitor, and data is stored in the capacitor. A capacitor formed on a semiconductor substrate is not necessarily completely isolated from peripheral circuits, and therefore, it is possible for the data stored in the memory cell to be altered due to current leakage. Thus, a refresh operation for periodically recharging the data stored in the memory cell is required. A self-refresh operation of a semiconductor memory device is performed while sequentially varying internal addresses by an externally applied command signal.

According to recent trends in highly integrated, large capacitance semiconductor memory devices, a plurality of memory banks are commonly incorporated within a memory chip. Each memory bank is capable of outputting a predetermined amount of data. DRAMs installed on recent systems, including cordless telephones, data banks, Pentium®-type computer combined personal data assistance (PDA) systems, utilize most memory banks during a data communication mode, while utilizing only specific memory banks for storing data necessary for the system during a standby mode. In order to implement PDA systems, which commonly operate on battery power, it is necessary to minimize power consumption.

FIG. 1 is a block diagram of circuits utilized during a self-refresh operation for a conventional DRAM. In this specification, for the sake of convenience in explanation, a DRAM having four memory banks 101_i (i is an integer from 1 to 4) is illustrated. In FIG. 1, circuit portions related to a self-refresh operation are schematically shown while circuit portions unrelated to the self-refresh operation are not shown.

The respective memory banks 101_i have a plurality of memory cells arranged in columns and rows. Row decoders 103_i define row addresses in the corresponding memory bank. Column decoders 105_1 and 105_2 define column addresses in the corresponding memory bank. A refresh entry detector 107 detects a signal to enter self-refresh operation, and, in response, generates a refresh instruction signal PRFH. In response to a refresh instruction signal PRFH, an internal address generator and counter 109 spontaneously generates sequential addresses FRA1 to FRAn for a self-refresh operation, with the internal addresses being sequentially varied. A switch 111 receives external addresses A1 to An during a normal operating mode and receives the counting addresses FRA1 to FRAn during a refresh mode, and transfers the same to the row decoders 103_i as internal addresses RA1 to RAn.

The self-refresh operation is executed in the following manner. A semiconductor memory device enters into a self-refresh mode in response to an externally input command signal. Then, row addresses are sequentially increased or decreased at predetermined intervals. Word lines of a memory cell are selected sequentially by varying the row addresses. The charge accumulated in the capacitor corresponding to the selected word line is amplified by a sense amplifier and then stored in the capacitor again. Through such a refresh operation, the stored data is retained without loss. This self-refresh operation consumes a large amount of current during the process of sense-amplifying the data stored in the capacitor.

In the conventional DRAM shown in FIG. 1, a self-refresh operation is performed with respect to all memory banks. In other words, even if data is stored in only a specific memory bank, the self-refresh operation is performed on all memory banks.

Furthermore, although separate internal voltage generators 113_i (i is an integer from 1 to 4), including, for example, a back-bias voltage generator or an internal power-supply voltage generator, generally exist for each memory bank, they are all operated during a refresh operation.

As described above, the conventional DRAM performs a self-refresh operation with respect to all memory banks, resulting in unnecessary current dissipation. Also, if a self-refresh mode is entered, all the internal voltage generators existing for each memory bank operate, thereby further increasing current dissipation.

SUMMARY OF THE INVENTION

To address the above limitations, it is an object of the present invention to provide a dynamic random access memory (DRAM) having a plurality of memory banks, the DRAM capable of selectively performing a self-refresh operation with respect to individual memory banks.

It is another object of the present invention to provide a DRAM which can reduce power consumption by controlling the operation of an internal voltage generating circuit portion associated with a selective refresh operation for a particular selected memory bank or subset of memory banks.

Accordingly, to achieve the first object, there is provided a dynamic random access memory (DRAM) including a plurality of memory banks capable of being independently accessed, and a refresh controller for selectively performing a refresh operation for one or more memory banks among the plurality of memory banks during a self-refresh operation.

The one or more memory banks may be refreshed according to a combination of control signals.

According to another aspect of the present invention, there is provided a dynamic random access memory (DRAM) including a plurality of memory banks capable of being independently accessed, a plurality of voltage generators disposed to correspond to the respective memory banks, for supplying internal voltages to the memory banks, and a refresh controller for selectively performing a refresh operation for one or more memory banks among the plurality of memory banks during a self-refresh operation, wherein the voltage generators are enabled according to whether or not a refresh operation is performed with respect to the memory banks.

To achieve the second object, there is provided a dynamic random access memory (DRAM) including a plurality of memory banks having a plurality of memory cells arranged in columns and rows, wherein the DRAM is capable of selectively refreshing data stored in each memory bank in a self-refresh mode, the DRAM including a plurality of row decoders for selecting word lines of the memory cells of the memory banks, an address generator for generating internal addresses which sequentially vary during a self-refresh mode, a refresh bank designating circuit for generating refresh bank designating signals for designating a memory bank to be refreshed, and a bank selection decoder for designating one or more memory banks to be refreshed by the refresh bank designating signals and supplying refresh addresses to the row decoders corresponding to the designated memory banks according to the information of the internal addresses.

According to the DRAM of present invention, the self-refresh operation is performed with respect to only a selected memory bank or memory banks in which data is stored, rather than refreshing all memory banks as in the conventional DRAM, thereby minimizing current dissipation. Also, only the internal voltage generator corresponding to the memory bank on which the refresh operation is performed is driven, thereby further reducing current dissipation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
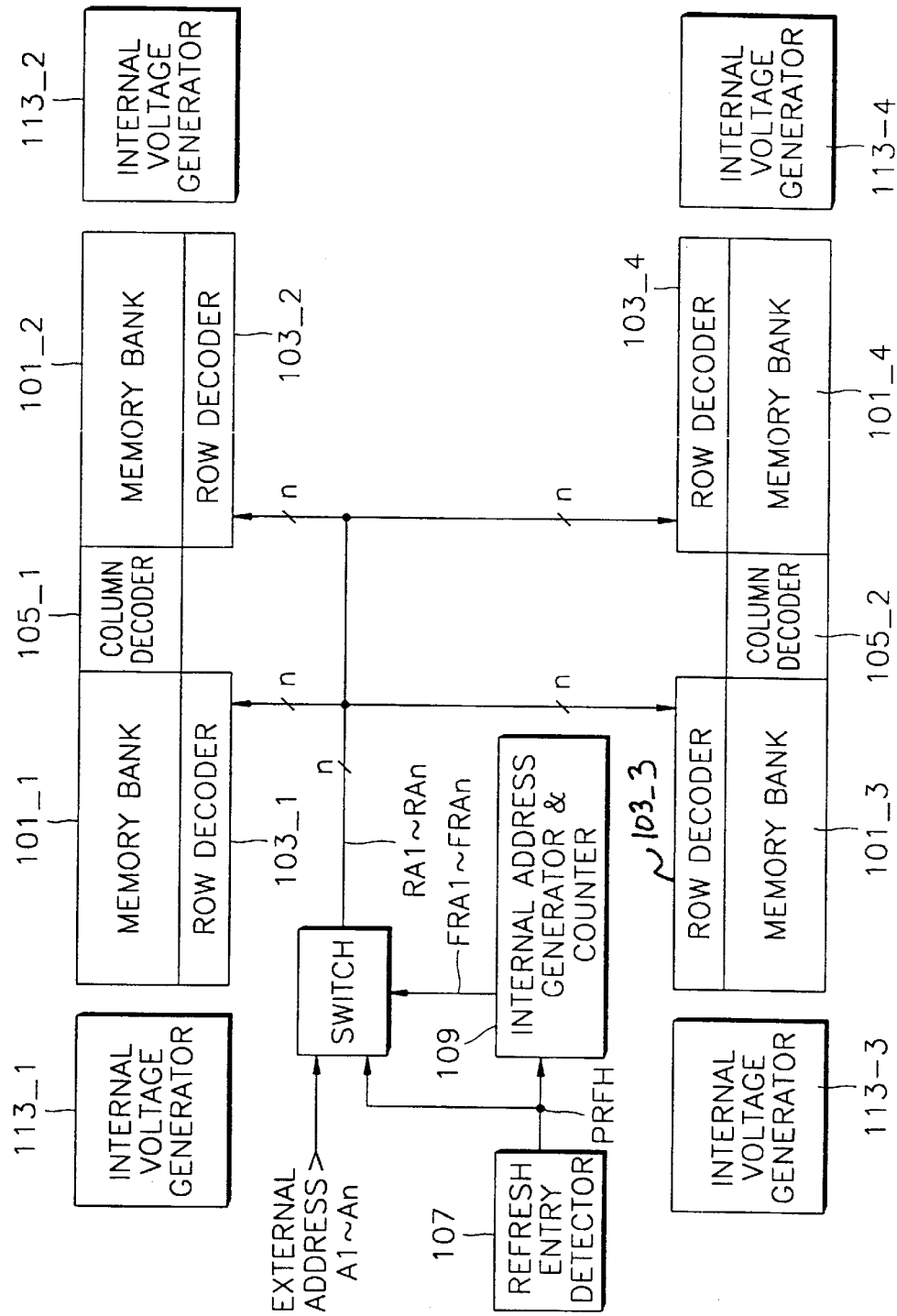
FIG. 1 is a block diagram illustrating circuits related to a refresh operation of a conventional DRAM device.

To fully understand the invention, the operational advantages thereof and the objects accomplished by the invention, preferred embodiments of the present invention will hereinafter be described with reference to the accompanying drawings. The same reference numerals in the respective drawings denote the same elements.

Figure 2:
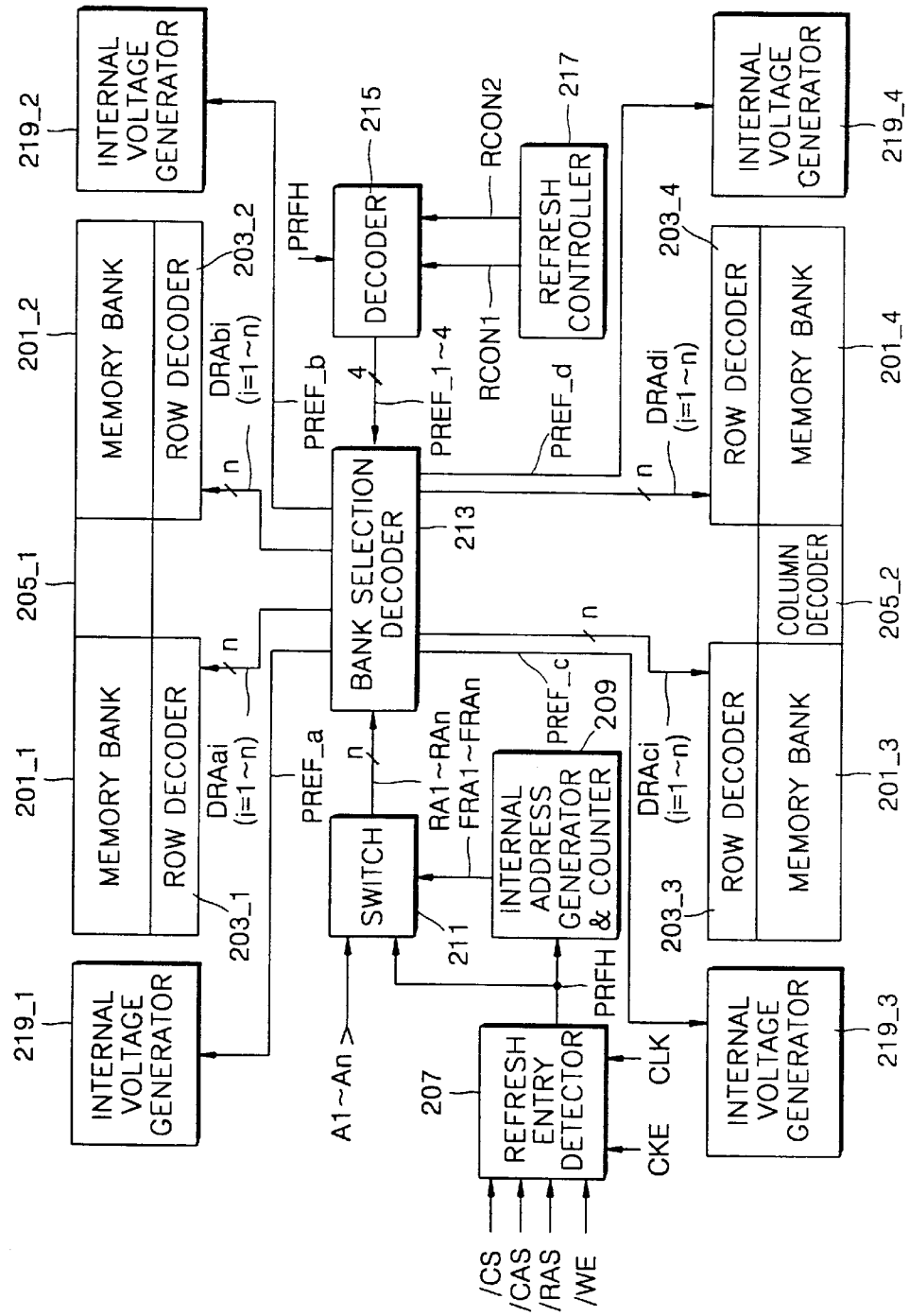
FIG. 2 is a block diagram illustrating circuits related to a refresh operation of a DRAM capable of selectively performing a self-refresh operation for each individual memory bank, according to a preferred embodiment of the present invention.

FIG. 2 is a block diagram illustrating circuits related to a refresh operation of a DRAM capable of selectively performing a self-refresh operation for each memory bank individually, according to a preferred embodiment of the present invention.

Referring to FIG. 2, the DRAM capable of selectively performing a self-refresh operation for each memory bank individually, according to a preferred embodiment of the present invention, includes a plurality of memory banks $201\_i$. In the specification, for the sake of convenience in explanation, a DRAM having four memory banks $201\_i$ (where i is an integer from 1 to 4) will be described by way of example. The invention is equally applicable to DRAMs having a plurality of memory banks other than four in number.

The respective memory banks $201\_i$ have a plurality of memory cells arranged in columns and rows. Row decoders $203\_i$ designate row addresses in the corresponding memory banks. For example, the row decoder $203\_1$ selects a row address in the memory bank $201\_1$.

Column decoders $205\_1$ and $205\_2$ designate column addresses in the corresponding memory banks. For example, the column decoder $205\_1$ selects column addresses in the memory banks $201\_1$ and $201\_2$.

In response to entry into a self-refresh mode, a refresh entry detector 207 generates a refresh instruction signal PRFH. In other words, if the self-refresh mode is entered, the refresh instruction signal PRFH is activated to a logic "high" level. The structure and operation of the refresh entry detector 207 will later be described in detail with reference to FIG. 3.

An internal address generator and counter 209 generates a pulse for each predetermined period during a self-refresh operation and generates counting addresses FRA1 to FRAn sequentially increasing in response to the pulses. The combination of the counting addresses FRA1 to FRAn sequentially changes the designated row addresses. A switch 211, activated by the refresh instruction signal PRFH generated in the refresh entry detector 207, receives external addresses A1 to An during operation in a normal mode and receives the counting addresses FRA1 to FRAn during operation in the refresh mode, and, in turn, generates internal addresses RA1 to RAn. The operation of the switch 211 will later be described in detail with reference to FIG. 5.

Referring back to FIG. 2, in addition to the circuits included in the conventional DRAM, the DRAM of the present invention further includes a bank selection decoder 213, a decoder 215 and a refresh controller 217. The decoder 215 and the refresh controller 217 are preferably implemented by a refresh bank designating circuit of the present invention, described below. Also, the bank selection decoder 213, the decoder 215 and the refresh controller 217 can be implemented by a refresh controlling circuit of the present invention, described below The decoder 215 generates first through fourth refresh bank designating signals PREF_i (Here, i is an integer from 1 to 4). Memory banks 201_1 to be refreshed are determined by the first through fourth refresh bank designating signals PREF_1 to PREF_4.

The refresh controller 217 generates refresh control signals RCON_1 and RCON2 and supplies the same to the decoder 215. There may be more than the two refresh control signals RCON_1 and RCON2. The refresh control signals RCON_1 and RCON2 control selection of memory banks to be refreshed. The refresh controller 217 will be described in detail below with reference to FIGS. 6, 7 and 8.

The decoder 215 decodes the refresh control signals RCON1 and RCON2 in a self-refresh mode to generate the first through fourth refresh bank designating signals PREF_1 to PREF_4. The decoder 215 will later be described in detail with reference to FIG. 9.

The bank selection decoder 213 receives the first through fourth refresh bank designating signals PREF_1 to PREF_4 and the internal addresses RA1 to RAn in the self-refresh mode. The bank selection decoder 213 supplies refresh addresses DRAai (where i is an integer from 1 to 4) to the row decoders of the memory banks selected by the first through fourth refresh bank designating signals PREF_1 to PREF_4 and a combination thereof.

For example, in the case where the first memory bank 201_1 (FIG. 2) is selected by the first through fourth refresh bank designating signals PREF_1 to PREF_4 to then be refreshed, the data of the internal addresses RA1 to RAn is supplied as the refresh addresses DRAa1 to DRAa4 to the row decoder 203_1 which selects a row address of the memory cell of the memory bank 201_1. The bank selection decoder 213 will later be described in detail with reference to FIGS. 10 through 13.

The internal voltage generators 219_i (where i is an integer from 1 to 4) supply DC voltages to circuits associated with the respective memory banks 201_i, and may include one or more circuits selected from a back-bias voltage generator, an internal power-supply voltage generator and other internal voltage generating circuits. In the DRAM of the present invention, the internal voltage generators 113_i exist for each memory bank and are enabled to be driven only when a self-refresh operation is performed on the corresponding memory bank. Here, for the sake of convenience in explanation, with respect to a self-refresh mode, the case where the internal voltage generators 219_i are enabled for each memory bank is representatively described. However, it is evident to one skilled in the art that the present invention can be applied to all operation modes in addition to the self-refresh mode.

Typical examples of the internal voltage generators 219_i (i=1 . . . 4) will later be described in detail with reference to FIG. 14.

Figure 3:
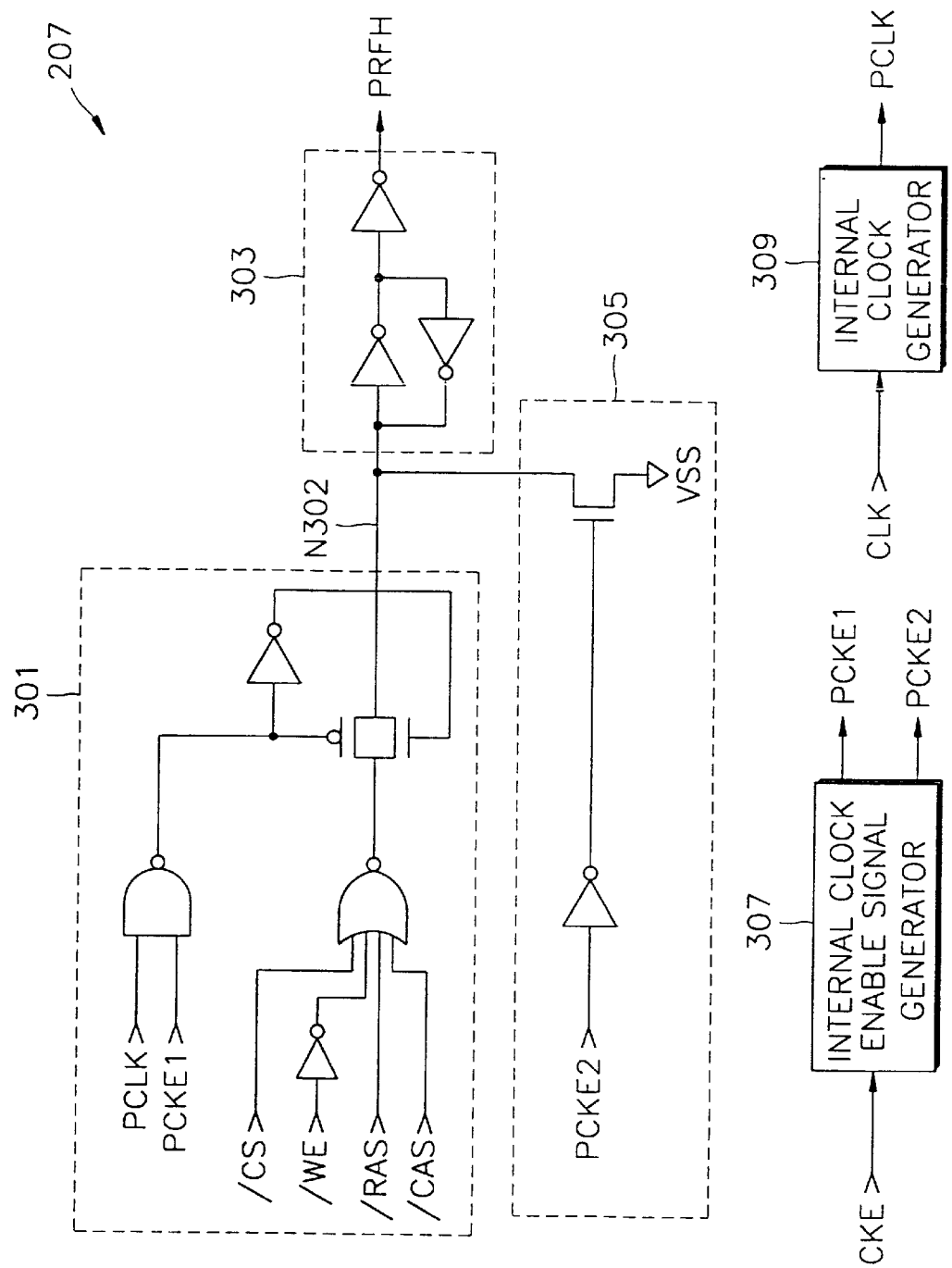
FIG. 3 is a detailed circuit diagram illustrating the refresh entry detector shown in FIG. 2.
Figure 4:
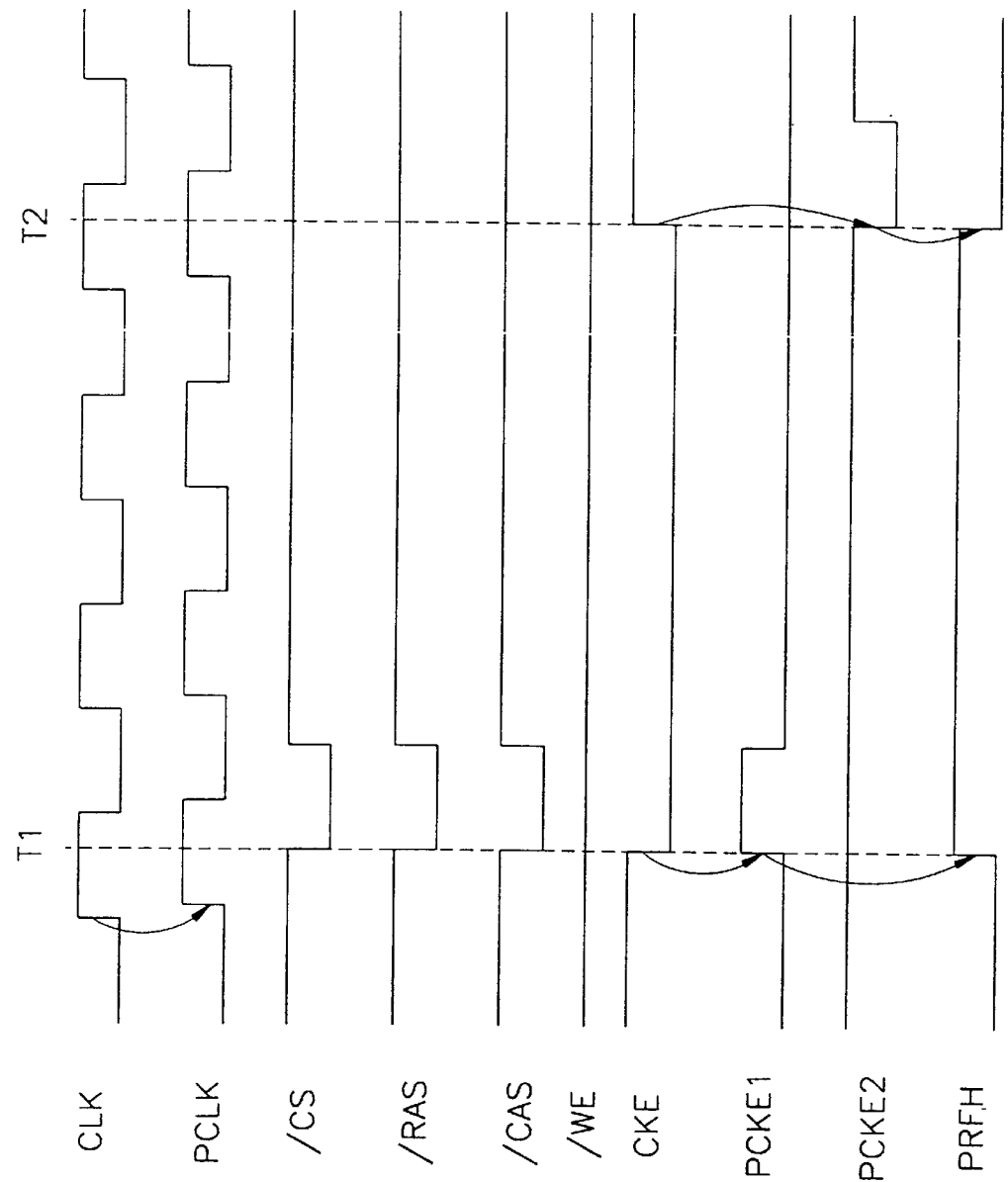
FIG. 4 is a timing diagram of various signals shown in FIG. 3.

FIG. 3 is a detailed circuit diagram of the refresh entry detector 207 shown in FIG. 2, and FIG. 4 is a timing diagram of various signals shown in FIG. 3. Referring to FIGS. 3 and 4, the structure and operation of the refresh entry detector 207 will now be described.

The refresh entry detector 207 includes an entry detecting part 301, a latching part 303 and a termination detecting part 305. The entry detecting part 301 detects the entry into a self-refresh mode by means of an internal clock signal PCLK, a first internal clock enable signal PCKE1, a chip selection signal/CS, a column address strobe signal/RAS and a write enable signal/WE. In other words, if a semiconductor memory device enters into a self-refresh mode, the output signal N302 of the entry detecting part 301 makes a transition to a logic "high" state.

The latching part 303 latches the output signal N302 of the entry detecting part 301 to generate the refresh instruction signal PRFH. If the self-refresh operation is terminated, the termination detecting part 305 pulls down the output signal N302 of the entry detecting part 301 to a logic "low" state in response to a second internal clock enable signal PCKE2.

The internal clock enable signal generator 307 generates first and second internal clock enable signals PCKE1 and PCKE2 in response to the clock enable signal CKE. The internal clock generator 309 generates the internal clock signal PCLK in response to a clock signal CLK.

Referring to FIG. 4, the clock signal CLK is a master clock of a semiconductor memory device, and the internal clock signal PCLK is a pulse which is activated in a synchronous relationship with the rising edge of the clock signal CLK. The clock enable signal CKE is a signal which instructs the effectiveness of a next clock. The clock enable signal CKE in the present invention transitions "low" when the self-refresh operation is performed. The first internal clock enable signal PCKE1 is generated as a logic "high" pulse in response to the falling edge of the clock enable signal CKE. The second internal clock enable signal PCKE2 is generated as a logic "low" pulse in response to a rising edge of the clock enable signal CKE.

Thus, if the chip selection signal/CS, the column address strobe signal /RAS and the row address strobe signal/RAS are all enabled to a logic "low" level and the clock enable signal CKE becomes a logic "low" level, the refresh instruction signal PRFH is latched to a logic "high" level, which means an entry into a self-refresh mode. Also, if the clock enable signal CKE becomes a logic "high" level, the refresh instruction signal PRFH is latched to a logic "low" level, which represents a termination of a self-refresh mode.

Figure 5:
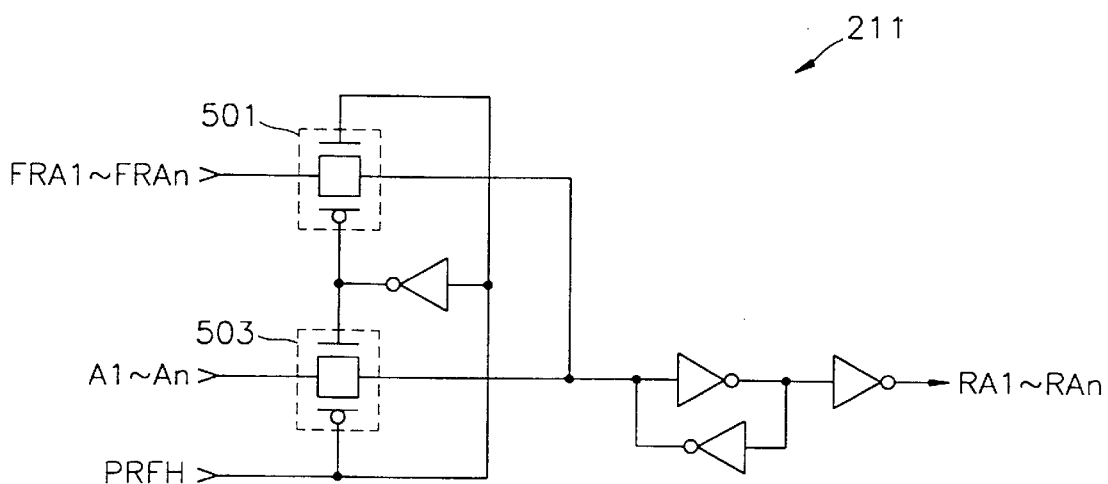
FIG. 5 is a circuit diagram illustrating the switch shown in FIG. 2.

FIG. 5 is a circuit diagram of the switch 211 shown in FIG. 2. Referring to FIG. 2, the switch 211 receives external addresses A1 to An or counting addresses FRA1 to FRAn to generate internal addresses RA1 to RAn. In other words, during a self-refresh mode in which the refresh instruction signal PRFH is at a logic "high" level, a transfer gate 501 is turned on. Thus, the internal addresses RA1 to RAn are latched to data identical with that of the counting addresses FRA1 to FRAn. Also, during a normal mode in which the refresh instruction signal PRFH is at a logic "low" level, a transfer gate 503 is turned on. Thus, the internal addresses RA1 to RAn are latched to data identical with that of the external addresses A1 to An. Note that each transfer "gate" represents a plurality of "n" transfer gates, one for each bit on each address bus FRAn, An.

Figure 6:
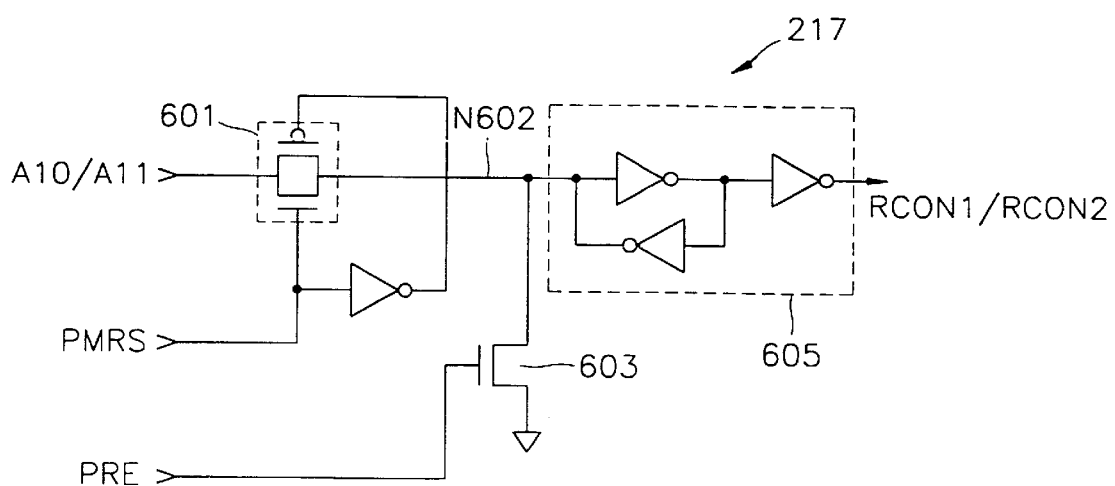
FIG. 6 is a circuit diagram illustrating the refresh controller shown in FIG. 2, in which a refresh control signal is generated by an external address.

FIG. 6 is a circuit diagram of the refresh controller 217 shown in FIG. 2, in which a refresh control signal is generated by external addresses. For the sake of convenience in explanation, for example, refresh control signals RCON1 and RCON2 are generated by external address bits A10 and A11. In alternative embodiments, the external addresses are not necessarily A10 or A11. Each refresh control signal RCON1/RCON2 is generated by one external address A10/A11.

Referring to FIG. 6, the refresh controller 217 includes a transfer gate 601, an NMOS transistor 603 and a latch 605. The transfer gate 601 receives specific external addresses A10 and A11 during a period in which a mode register setting signal PMRS is at a logic "high" level. Here, the mode register setting signal PMRS is activated to a logic "high" level in a period in which a combination of DRAM control signals, for example, /RAS, /CAS, /CS and /WE, are all activated.

The NMOS transistor 603 is gated by a precharge signal PRE which is activated to a logic "high" level for a predetermined time duration in an initial power-up period of a power supply voltage. The latch 605 latches a signal N602 generated by the external addresses A10 and A11 transferred by the transfer gate 601, or the precharge signal PRE.

Thus, the refresh control signals RCON1 and RCON2 are latched to a logic "low" level in a precharge period. After the precharge signal is latched to a logic "low" level, the external addresses A10 and A11 input in the period where the mode register setting signal PMRS is at a logic "high" level is transferred by the transfer gate 601.

At this stage, the refresh control signals RCON1 and RCON2 are generated by the external addresses A10 and A11. In other words, in the case where the external addresses A10 and A11 are at a logic "high" level, the refresh control signals RCON1 and RCON2 are latched to a logic "high" level. Also, in the case where the external addresses A10 and A11 are at a logic "low" level, the refresh control signals RCON1 and RCON2 are latched to a logic "low" level.

In the refresh controller 217 shown in FIG. 6, in the case where the external addresses A10 and A11 designate memory banks for storing data, the refresh operation in the DRAM of the present invention is performed only with respect to memory banks in which data is stored.

Figure 7:
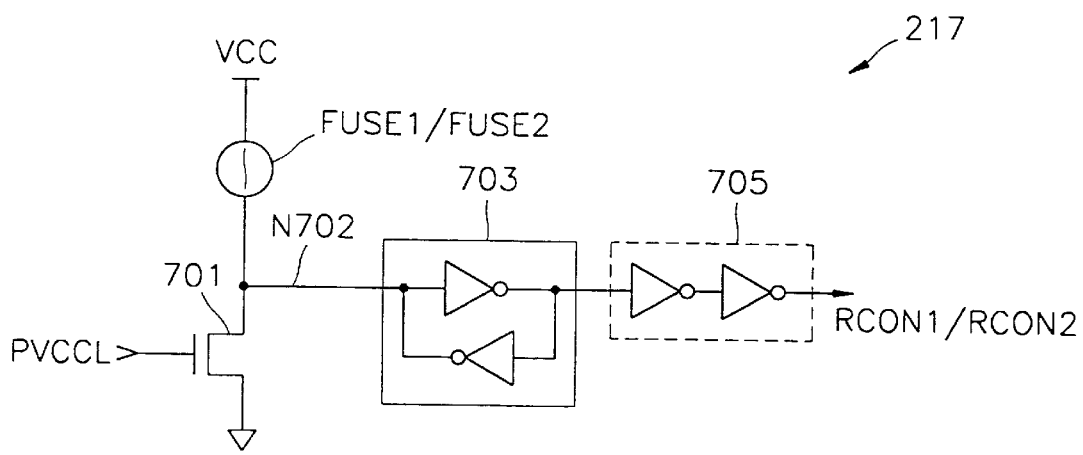
FIG. 7 is circuit diagram of another example of the refresh controller shown in FIG. 2, in which a refresh control signal is controlled by a control fuse.

FIG. 7 is another circuit diagram of the refresh controller 217 shown in FIG. 2, in which refresh control signals RCON1 and RCON2 are controlled by a control fuse. Here, for convenience' sake of explanation, the refresh control signals RCON1 and RCON2 are generated by control fuses FUSE1 and FUSE2.

The refresh controller 217 shown in FIG. 7 includes control fuses FUSE1 and FUSE2, an NMOS transistor 701, a latch 703 and a buffer 705. The NMOS transistor 701 has a relatively large resistance element. Thus, if the control fuses FUSE1 and FUSE2 are opened, the drain port N702 of the NMOS transistor 701 becomes "low". Here, the refresh control signals RCON1 and RCON2 are latched to a logic "high" level.

In such a refresh controller shown in FIG. 7, in the case where there is further provided an apparatus for performing cutting of the control fuses FUSE1 and FUSE2 by address information for designating the memory bank for storing data, the refresh operation in the DRAM of the present invention can be performed only with respect to the memory bank in which data is stored.

Figure 8:
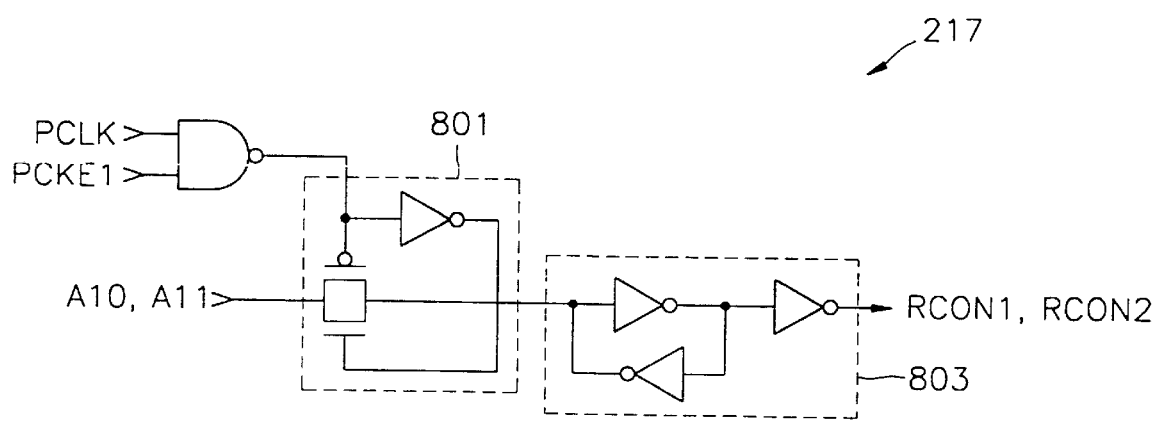
FIG. 8 is a another circuit diagram of the refresh controller shown in FIG. 2.

FIG. 8 is still another circuit diagram of the refresh controller 217 shown in FIG. 2, in which refresh control signals are generated by external addresses, like in FIG. 6. Referring to FIG. 8, the refresh controller 217 includes a transfer gate 801 and a latch 803. The transfer gate 801 receives external addresses A10 and A11 during a period in which a first internal clock enable signal PCKE1 and an internal clock signal PCLK are in a logic "high" level. The latch 803 latches the external addresses A10 and A11 transferred by the transfer gate 801 to generate the refresh control signals RCON1 and RCON2. In other words, in the case where the external addresses A10 and A11 are at a logic "high" level, the refresh control signals RCON1 and RCON2 are latched to a logic "high" level. Also, in the case where the external addresses A10 and A11 are at a logic "low" level, the refresh control signals RCON1 and RCON2 are latched to a logic "low" level.

Figure 9:
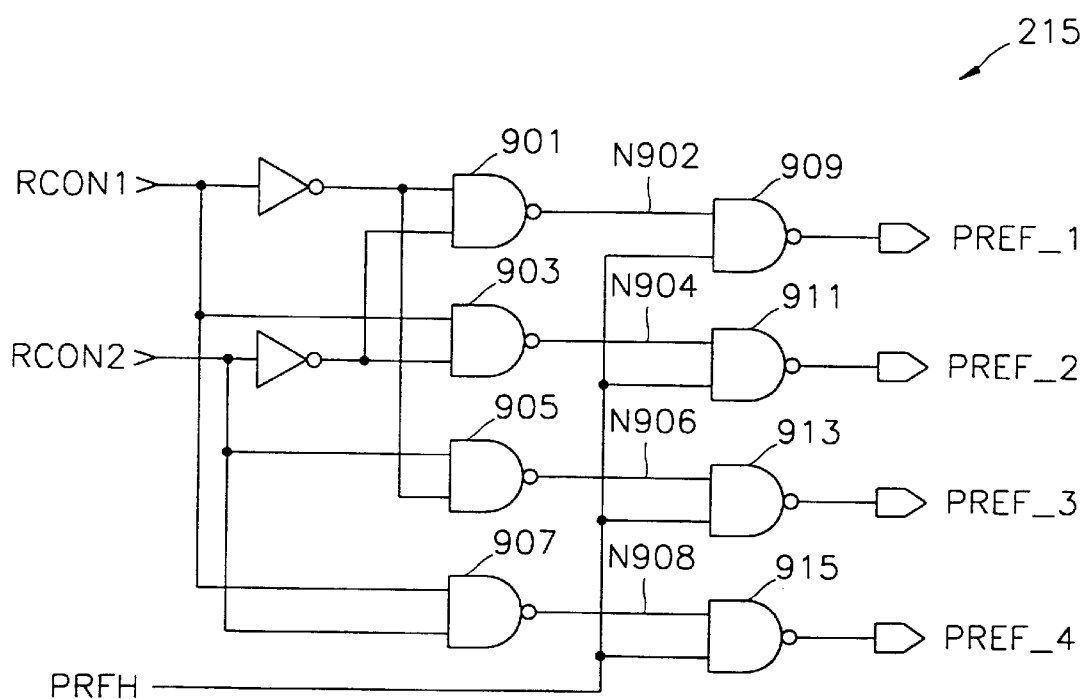
FIG. 9 is a detailed circuit diagram of the decoder shown in FIG. 2.

FIG. 9 is a detailed circuit diagram of the decoder 215 shown in FIG. 2. Referring to FIG. 9, the decoder 215 includes four NAND gates 909, 911, 913 and 915 enabled during operation in a refresh mode in which the refresh instruction signal PRFH is at a logic "high" level, and another group of four NAND gates 901, 903, 905 and 907 for decoding the refresh control signals RCON1 and RCON2.

In the refresh mode, if the refresh control signals RCON1 and RCON2 are both at a logic "low" level, the output signal N902 of the NAND gate 901 becomes "low". In response, the first refresh bank designating signal PREF_1 which is the output signal of the NAND gate 909, becomes "high".

In the refresh mode, if the refresh control signal RCON_1 is at a logic "high" level, and RCON2 is at a logic "low" level, the output signal N904 of the NAND gate 903 becomes "low". In response, the second refresh bank designating signal PREF_2, which is the output signal of the NAND gate 911, becomes "high".

In the refresh mode, if the refresh control signals RCON1 is at a logic "low" level, and RCON2 is at a logic "high" level, the output signal N906 of the NAND gate 905 becomes "low". In response, the third refresh bank designating signal PREF_2, which is the output signal of the NAND gate 913, becomes "high".

In the refresh mode, if the refresh control signals RCON1 and RCON2 are both at a logic "high" level, the output signal N908 of the NAND gate 907 becomes "low". The fourth refresh bank designating signal PREF_4, which is the output signal of the NAND gate 915, becomes "high".

Figure 10:
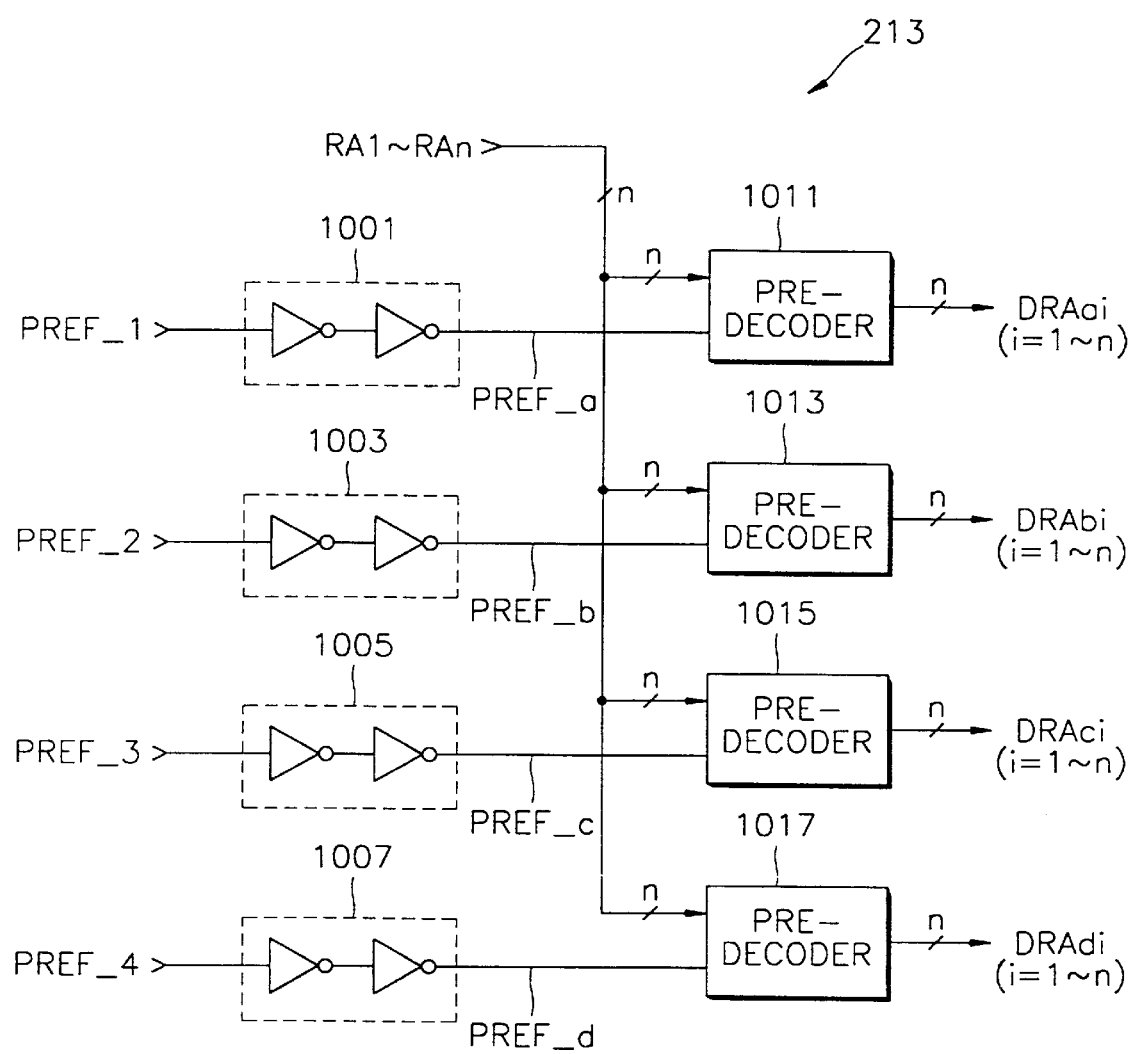
FIG. 10 is a circuit diagram of the bank selection decoder shown in FIG. 2, in which a bank is selected by a refresh bank designating signal.

FIG. 10 is a circuit diagram of the bank selection decoder 213 shown in FIG. 2, in which a bank is selected by a refresh bank designating signal. Referring to FIG. 10, the bank selection decoder 213 includes four buffers 1001, 1003, 1005 and 1007 and four pre-decoders 1011, 1013, 1015 and 1017.

The buffers 1001, 1003, 1005 and 1007 buffer the first through fourth refresh bank designating signals PREF_1 through PREF_4 to generate first through fourth decoding signals PREF_j (j=a, b, c and d). Thus, the first through fourth decoding signals PREF_a through PREF_d represent the same information as that of the first through fourth refresh bank designating signals PREF_1 through PREF_4. Referring back to FIG. 2, the first through fourth decoding signals PREF_a through PREF_d are supplied to the internal voltage generators 219_1 through 219_4, respectively, to control the same.

Referring back to FIG. 10, the pre-decoders 1011, 1013, 1015 and 1017 are enabled in response to the first through fourth decoding signals PREF_a through PREF_d. Also, the enabled pre-decoders 1011, 1013, 1015 and 1017 receive internal addresses RA1 to RAn to generate refresh addresses DRAji (where j=a, b, c and d and i=1 to n.). The pre-decoders 1011, 1013, 1015 and 1017 will be described later in more detail with reference to FIGS. 11 and 12.

The operation of the bank selection decoder 213 shown in FIG. 10 will now be described for the case in which the first refresh bank designating signal PREF_1 is activated. If the first refresh bank designating signal PREF_1 is activated, the first decoding signal PREF_a is activated. As the first decoding signal PREF_a is activated, the first pre-decoder 1011 is enabled. Thus, the first refresh addresses DRAai (i=1 to n) have the same information as the internal addresses RA1 to RAn. The first refresh addresses DRAai (i=1 to n) are transferred to the first row decoder 203_1 for decoding rows of the first memory bank 201_1 (FIG. 2) to then refresh memory cells of the first memory bank 201_1.

When the first refresh bank designating signal PREF_1 is activated in the bank selection decoder 213, the second through fourth refresh bank designating signals PREF_2 through PREF_4 are deactivated and the second through fourth pre-decoders 1013, 1015 and 1017 are disabled. Thus, the second through fourth refresh addresses DRAji, (j=b, c and d, and i=1 to n.) are maintained at a logic "low" level, which is a precharged state. Thus, the refresh operation is not performed on the memory cells of the second through fourth memory banks 201_2 through 201_4. In the case of implementing a DRAM capable of selectively performing a refresh operation for each bank using the bank selection decoder 213 shown in FIG. 10, only one memory bank is selected and then refresh addresses are supplied thereto.

Referring back to FIGS. 9 and 10, banks are selected based on the refresh control signals RCON1 and RCON2 as follows.

TABLE 1

| RCON1 | RCON2 | Bank selection |
|---|---|---|
| 0 | 0 | First memory bank |
| 0 | 1 | Second memory bank |
| 1 | 0 | Third memory bank |
| 1 | 1 | Fourth memory bank |

Figure 11:
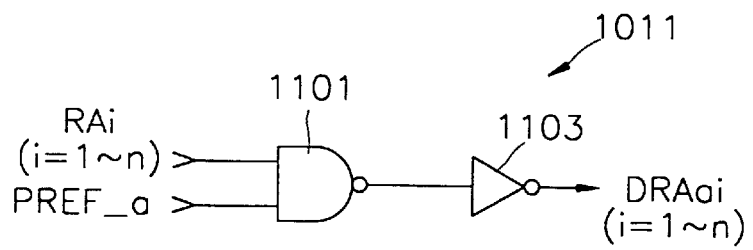
FIG. 11 is a detailed circuit diagram of a pre-decoder shown in FIG. 10.

FIG. 11 is a detailed circuit diagram of a pre-decoder shown in FIG. 10. Since the first through fourth pre-decoders are implemented by the same configuration, the first pre-decoder 1011 will be representatively described.

Referring to FIG. 11, the first pre-decoder 1011 is implemented by a NAND gate 1101 and an inverter 1103. The NAND gate 1101 is enabled by activation of the first decoding signal PREF_a. Thus, the first refresh addresses DRAai (i=1 to n) carry the same information as the internal address RAi (i=1 to n).

Figure 12:
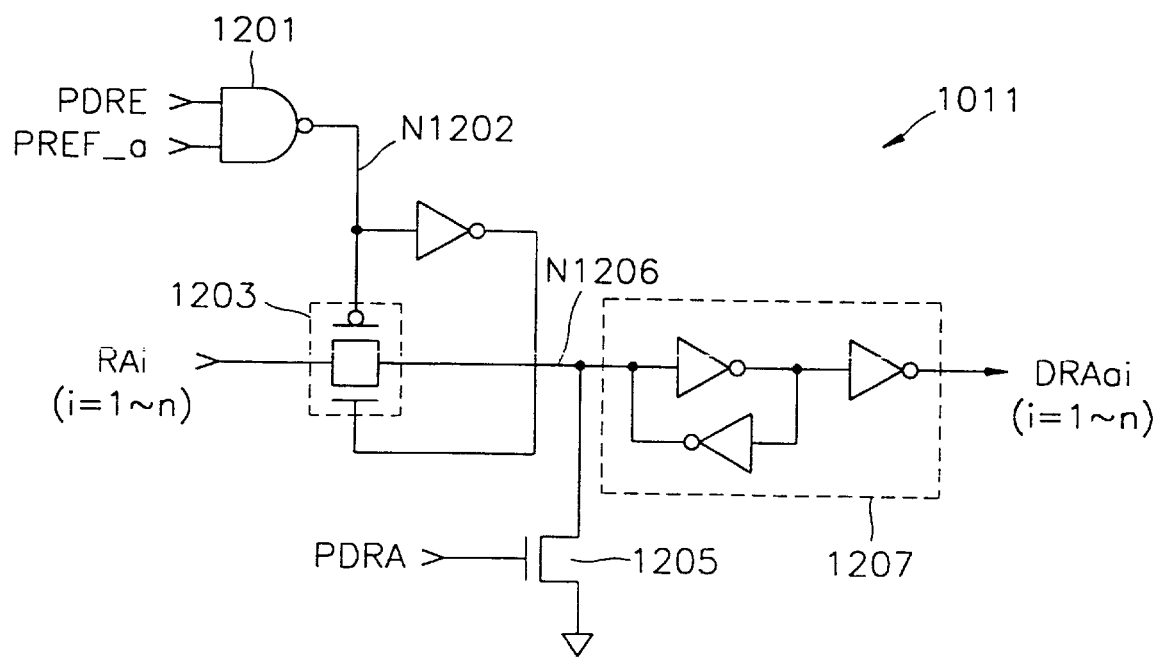
FIG. 12 is a another detailed circuit diagram of one of the pre-decoders shown in FIG. 10.

FIG. 12 is another detailed circuit diagram of a pre-decoder shown in FIG. 10. Referring to FIG. 12, the first pre-decoder 1011 shown in FIG. 12 includes a NAND gate 1201, a transfer gate 1203, an NMOS transistor 1205 and a latch 1207. The NAND gate 1201 receives the first decoding signal PREF_a and the first precharge control signal PDRE. Also, the output signal N1202 of the NAND gate 1201 controls the transfer gate 1203. The first precharge signal PDRE is at a logic "low" state in a precharge period and goes "high" after the precharge period.

The transfer gate 1203 receives internal addresses RAi (i=1 to n) in response to the output signal N1202 of the NAND gate 1201. The NMOS transistor 1205 precharges the first refresh addresses DRAai (i=1 to n) which are output signals of the first pre-decoder 1011 to a logic "low" level in response to the second precharge control signal PDRA which is activated in the precharge period. The latch 1207 latches the signal transferred by the transfer gate 1203 or the precharged signal by the NMOS transistor 1205.

Thus, if the precharge period is terminated and the first decoding signal PREF_a is activated, the refresh addresses DRAai (i=1 to n) are latched to have the same information as the internal addresses RAi (i=1 to n).

Figure 13:
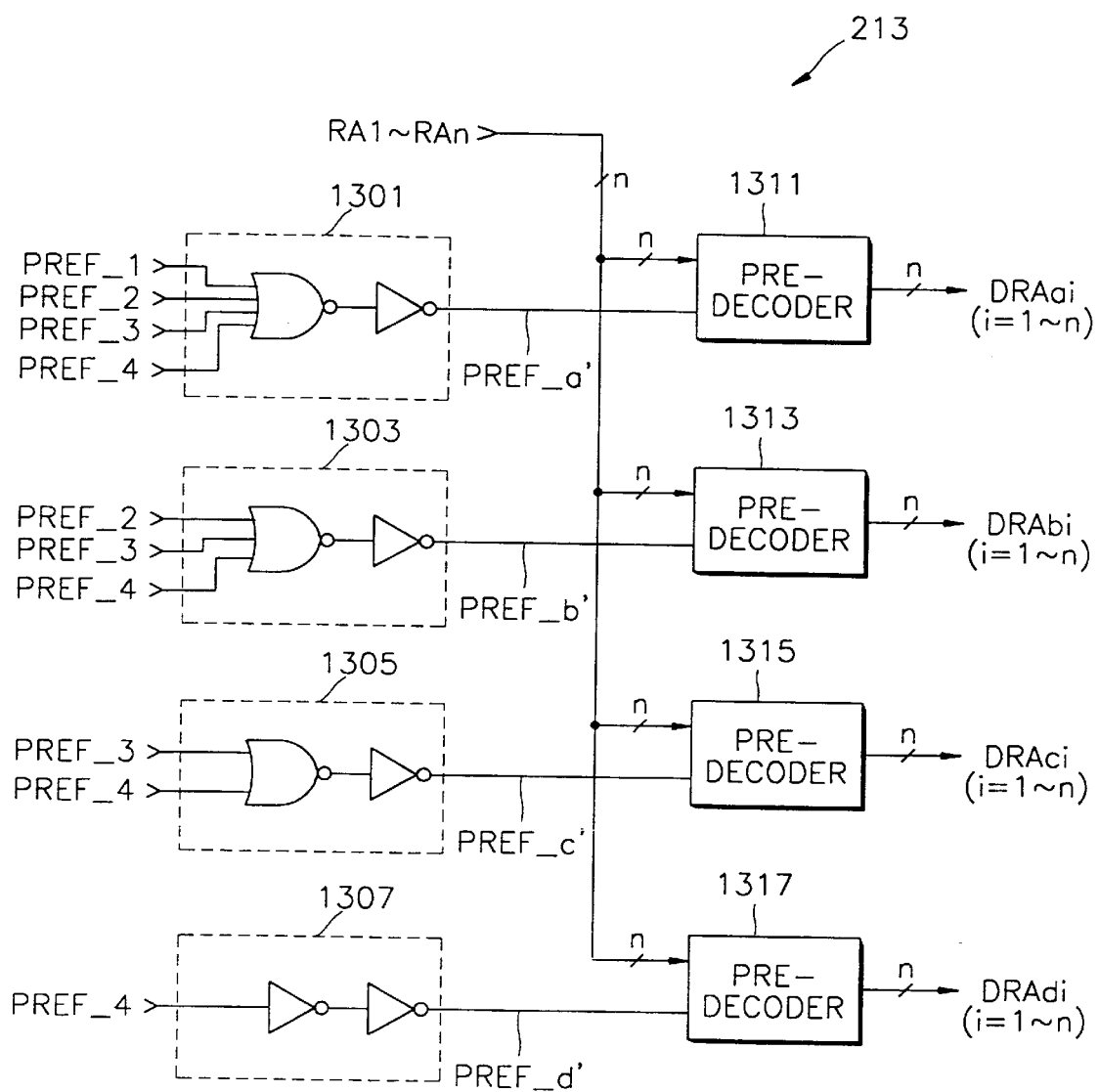
FIG. 13 is another circuit diagram of a bank selection decoder shown in FIG. 2, in which the number of refreshed banks can be variably controlled.

FIG. 13 is another circuit diagram of the bank selection decoder shown in FIG. 2, in which the number of the banks to be refreshed can be variably controlled. Referring to FIG. 13, the bank selection decoder 213 includes four logic elements 1301, 1303, 1305 and 1307 and four pre-decoders 1311, 1313, 1315 and 1317.

The first logic element 1301 receives the first through fourth refresh bank designating signals PREF_i (i=1 to 4) as input signals and performs an OR operation to generate a first decoding signal PREF_a'. The second logic element 1303 receives the second through fourth refresh bank designating signals PREF_i (i=2 to 4) as input signals and performs an OR operation to generate a second decoding signal PREF_b'. The third logic element 1305 receives the third and fourth refresh bank designating signals PREF_i (i=3 and 4) as input signals and performs an OR operation to generate a third decoding signal PREF_c'. The fourth logic element 1307 receives the fourth refresh bank designating signal PREF_4 as an input signal to generate a fourth decoding signal PREF_d'.

The decoding signals are controlled according to the activation of the first through fourth refresh bank designating signals PREF_i (i=1 to 4) as follows.

If the first refresh bank designating signal PREF_1 is activated, the first decoding signal PREF_a' is activated and the second through fourth decoding signals PREF_b' are deactivated. Thus, while the first refresh addresses DRAai (i=1 to n) have the same information as the internal addresses RA1 to RAn, the second through fourth refresh addresses DRAbi, DRAci and DRAdi (i=1 to n) are maintained at a logic "low" level, which is a precharged state. Thus, the first memory bank 201_1 (FIG. 2) performs a refresh operation and the second through fourth memory banks 201_i (i=2 to 4) do not perform a refresh operation.

If the second refresh bank designating signal PREF_2 is activated, the first decoding signal PREF_a' and the second decoding signals PREF_b' are activated and the third and fourth decoding signals PREF_c' and PREF_d' are deactivated. Thus, while the first and second refresh addresses DRAai and DRAbi (i=1 to n) have the same information as the internal addresses RA1 to RAn, the third and fourth refresh addresses DRAci and DRAdi (i=1 to n) are maintained at a logic "low" level, which is a precharged state. Thus, the first and second memory banks 201_1 and 201_2 perform a refresh operation and the third and fourth memory banks 201_3 and 201_4 do not perform a refresh operation.

If the third refresh bank designating signal PREF_3 is activated, the first through third decoding signals PREF_a', PREF_b' and PREF_c' are activated and the fourth decoding signal PREF_d' is deactivated. Thus, while the first through third refresh addresses DRAai, DRAbi and DRAci (i=1 to n) have the same information as the internal addresses RA1 to RAn, the fourth refresh addresses DRAdi (i=1 to n) are maintained at a logic "low" level, which is a precharged state. Thus, the first through third memory banks 201_1, 201_2 and 201_3 perform a refresh operation and the fourth memory bank 201_4 does not perform a refresh operation.

If the fourth refresh bank designating signal PREF_4 is activated, the first through fourth decoding signals PREF_a', PREF_b', PREF_c' and PREF_d' are all activated. Thus, the first through fourth refresh addresses DRAai, DRAbi, DRAci and DRAdi (i=1 to n) have the same information as the internal addresses RA1 to RAn. Thus, the first and second memory banks 201_1, 201_2, 201_3 and 201_4 perform a refresh operation.

The first through fourth pre-decoders 1311, 1313, 1315 and 1317 shown in FIG. 13 can be implemented by the same configuration as the predecoders 1011, 1013, 1015 and 1017 shown in FIG. 10, and a detailed explanation thereof will be omitted.

The bank selection decoder 213 shown in FIG. 13 can have a variable number of pre-decoders. Also, in the DRAM capable of selectively performing a refresh operation according to the present invention, it is possible to selectively refresh only those memory banks having memory cells in which data is stored. Also, the number of refreshed memory banks can be varied by using the bank selection decoder shown in FIG. 13.

Figure 14:
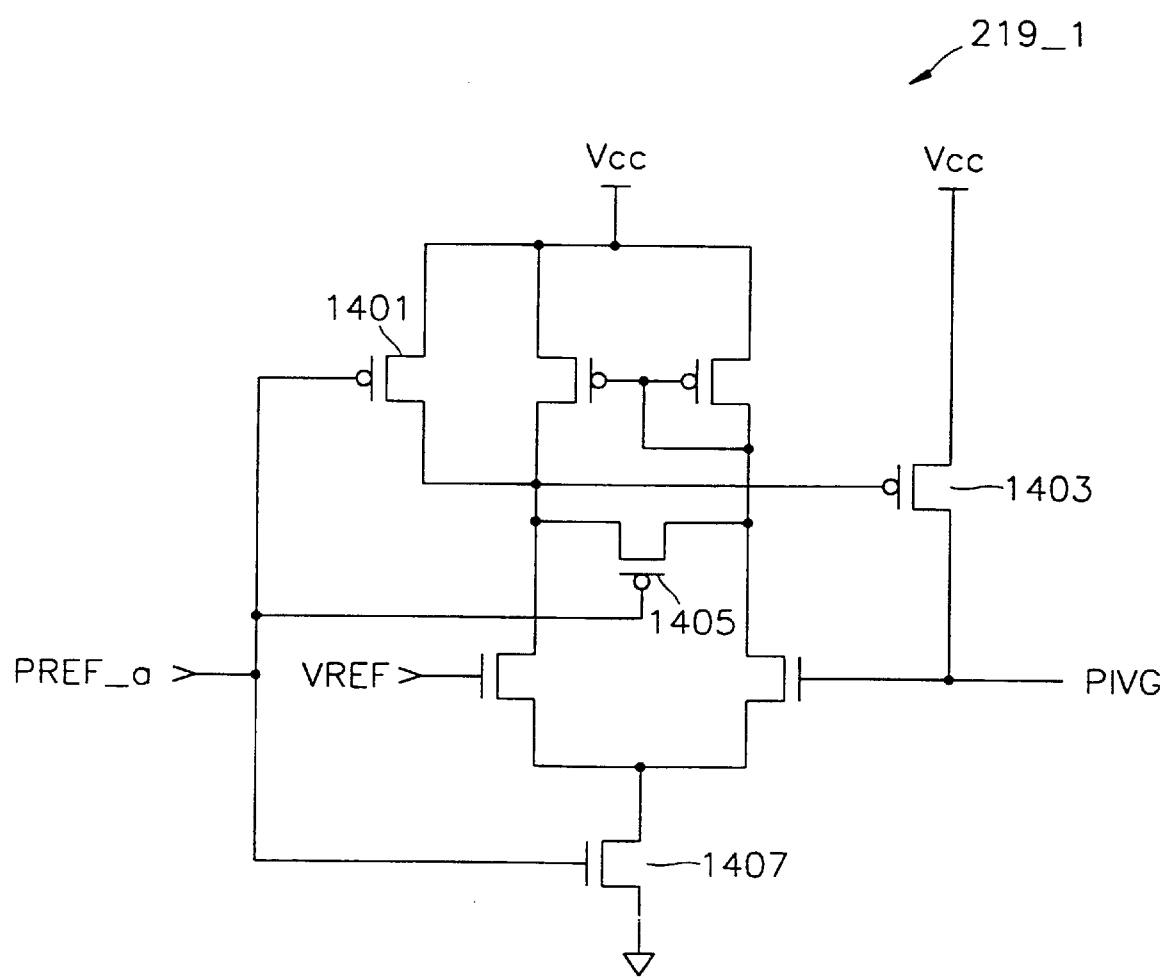
FIG. 14 is a circuit diagram of the internal voltage generator shown in FIG. 2.

FIG. 14 is a circuit diagram of an internal voltage generator shown in FIG. 1, in which an internal power-supply voltage generator is illustrated as an example of the internal voltage generator. However, it is evident to one skilled in the art that the invention can also be applied to a back-bias voltage generator. Also, although a first internal voltage generator 219_1 is representatively illustrated, the present invention can be applied to second through fourth internal voltage generators 219_i (i=2 to 4).

First, in the case where a refresh operation is performed with respect to a first memory bank 201_1 (see FIG. 2), a first decoding signal PREF a goes "high". Then, PMOS transistors 1401 and 1405 are turned off and an NMOS transistor 1407 is turned on. Thus, the internal power-supply voltage generator shown in FIG. 14 is enabled to generate an internal power supply voltage PIVG, as in the conventional art. Since the operational principle of generating the internal power supply voltage PIVG is well known to one skilled in the art, a detailed explanation thereof will be omitted.

In the case where a refresh operation is not performed with respect to the first memory bank 201_1, the first decoding signal PREF a goes "low". Then, the PMOS transistors 1401 and 1405 are turned on and the NMOS transistor 1407 and a PMOS transistor 1403 are turned off. Thus, the internal power-supply voltage generator shown in FIG. 14 is disabled to stop operating.

As described above, the internal power-supply voltage generator shown in FIG. 14 operates such that only the internal voltage generator corresponding to a memory bank on which the refresh operation is performed operates. Thus, the internal voltage generator corresponding to a memory bank on which the refresh operation is not performed stops operating, thereby greatly reducing power consumption.

While this invention has been particularly shown and described with references to preferred embodiments thereof, it will be understood by those skilled in the art that various changes in form and detail may be made herein without departing from the spirit and scope of the invention as defined by the appended claims.

For example, although a DRAM constituted by four memory banks has been described, the number of memory banks can be increased or decreased. Also, it has been described that refresh control signals are generated by address signals by way of example in the specification of the invention. However, the refresh control signals can also be generated by signals which are not used in a refresh mode.

What is claimed is:

1. A dynamic random access memory (DRAM) comprising:
   a plurality of individually-accessible memory banks; and
   a self-refresh controller for selectively performing a self-refresh operation for one or more memory banks among the plurality of memory banks during the self-refresh operation;
   wherein a selection control signal distinguishes active memory banks from inactive memory banks, wherein the self-refresh operation is performed exclusively on the active memory banks, and wherein the inactive memory banks are dormant during the self-refresh operation of the active memory banks.

2. The DRAM according to claim 1, wherein the selection control signal comprises a combination of control signals.

3. A dynamic random access memory (DRAM) comprising:
   a plurality of individually-accessible memory banks;
   a plurality of voltage generators corresponding to each of the respective memory banks, for supplying internal voltages to the respective memory banks; and
   a self-refresh controller for selectively performing a self-refresh operation for one or more memory banks among the plurality of memory banks during the self-refresh operation;
   wherein the voltage generators are selectively enabled according to whether the self-refresh operation is to be performed with respect to the corresponding memory banks, and
   wherein a selection control signal distinguishes active memory banks from inactive memory banks, wherein the self-refresh operation is performed exclusively on the active memory banks, and wherein the inactive memory banks are dormant during the self-refresh operation of the active memory banks.

4. The DRAM according to claim 3, wherein the enabled voltage generators are designated by a combination of control signals.

5. The DRAM according to claim 3, wherein the enabled voltage generators include at least one of a back-bias voltage generator and an internal power-supply voltage generator.

6. A dynamic random access memory (DRAM) including a plurality of memory banks, each memory bank having a plurality of memory cells arranged in columns and rows, wherein the DRAM is capable of selectively refreshing data stored in each memory bank during operation in a self-refresh mode, the DRAM comprising:
   a plurality of row decoders for selecting word lines of the memory cells in the memory banks;
   an address generator for generating internal addresses which sequentially vary during the self-refresh mode;
   a self-refresh bank designating circuit for selectively generating self-refresh bank designating signals for designating a memory bank to be refreshed in a self-refresh operation; and
   a bank selection decoder for designating one or more memory banks, among the plurality of the memory banks to be refreshed by the self-refresh bank designating signals and for supplying self-refresh addresses to the row decoders corresponding to the designated memory banks according to the internal addresses;
   wherein the self-refresh designating signals distinguish active memory banks from inactive memory banks, wherein the self-refresh operation is performed exclusively on the active memory banks, and wherein the inactive memory banks are dormant during the self-refresh operation of the active memory banks.

7. The DRAM according to claim 6, wherein the self-refresh bank designating circuit comprises:
   a self-refresh controller for generating self-refresh control signals for controlling selection of the memory banks to be refreshed; and
   a decoder for decoding the self-refresh control signals to generate the self-refresh bank designating signals.

8. The DRAM according to claim 7, wherein the self-refresh controller generates the self-refresh control signals in response to a predetermined external address signal.

9. The DRAM according to claim 7, wherein the self-refresh controller comprises:
   a self-refresh entry detector for generating a self-refresh entry signal which indicates entry of the DRAM into the self-refresh mode; and a self-refresh control signal generator enabled by activation of the self-refresh entry signal, for generating the self-refresh control signals in response to a predetermined external address signal.

10. The DRAM according to claim 7, wherein the self-refresh controller includes control fuses and generates the self-refresh control signals in response to a state of the control fuses.

11. The DRAM according to claim 6, wherein the bank selection decoder supplies the self-refresh addresses to the memory banks selected by the self-refresh bank designating signals.

12. The DRAM according to claim 6, wherein the bank selection decoder further comprises at least one pre-decoder enabled by the self-refresh bank designating signal, for supplying the self-refresh addresses corresponding to the internal addresses to the row decoders corresponding to the selected memory bank.

13. A dynamic random access memory (DRAM) comprising:

a plurality of memory banks capable of being independently accessed;

a plurality of voltage generators corresponding to the respective memory banks, for supplying internal voltages to the memory banks; and a self-refresh controller for selectively performing a self-refresh operation for one or more memory banks among the plurality of memory banks during the self-refresh operation;

wherein the number of enabled voltage generators is determined by the number of memory banks undergoing the self-refresh operations;

wherein a selection control signal distinguishes active memory banks from inactive memory banks, wherein the self-refresh operation is performed exclusively on the active memory banks, and wherein the inactive memory banks are dormant during the self-refresh operation of the active memory banks.

14. A dynamic random access memory (DRAM) including a plurality of memory banks, each memory bank having a plurality of memory cells arranged in columns and rows, wherein the DRAM is capable of selectively refreshing data stored in each memory bank during operation in a self-refresh mode, the DRAM comprising:

a plurality of row decoders for selecting word lines of the memory cells in the memory banks;

an address generator for generating internal addresses which sequentially vary during the self-refresh mode;

a self-refresh bank designating circuit for generating self-refresh bank designating signals for designating a memory bank to be refreshed in a self-refresh operation, the self-refresh bank designating circuit comprising: a self-refresh controller including control fuses for generating self-refresh control signals in response to a state of the control fuses, the self-refresh controller for controlling selection of the memory banks to be refreshed, and a decoder for decoding the self-refresh control signals to generate the self-refresh bank designating signals; and a bank selection decoder for designating one or more memory banks among the plurality of memory banks to be refreshed by the refresh bank designating signals and for supplying refresh addresses to the row decoders corresponding to the designated memory banks according to the internal addresses;

wherein the self-refresh bank designating signals distinguish active memory banks from inactive memory banks, wherein the self-refresh operation is performed exclusively on the active memory banks, and wherein the inactive memory banks are dormant during the self-refresh operation of the active memory banks.

* * * * *